United States Patent
Gupta et al.

(10) Patent No.: US 11,887,808 B2
(45) Date of Patent: Jan. 30, 2024

(54) HYBRID HIGH-TEMPERATURE ELECTROSTATIC CLAMP FOR IMPROVED WORKPIECE TEMPERATURE UNIFORMITY

(71) Applicant: Axcelis Technologies, Inc., Beverly, MA (US)

(72) Inventors: Atul Gupta, Lexington, MA (US); Scott E Galica, Belmont, MA (US)

(73) Assignee: Axcelis Technologies, Inc., Beverly, MA (US)

( * ) Notice: Subject to any disclaimer, the term of this patent is extended or adjusted under 35 U.S.C. 154(b) by 63 days.

(21) Appl. No.: 17/523,359

(22) Filed: Nov. 10, 2021

(65) Prior Publication Data
US 2022/0148847 A1 May 12, 2022

Related U.S. Application Data

(60) Provisional application No. 63/112,538, filed on Nov. 11, 2020.

(51) Int. Cl.
  *H01J 37/20* (2006.01)
  *H01L 21/683* (2006.01)
  *H01J 37/317* (2006.01)

(52) U.S. Cl.
  CPC .......... *H01J 37/20* (2013.01); *H01L 21/6833* (2013.01); *H01J 37/3171* (2013.01); *H01J 2237/2007* (2013.01)

(58) Field of Classification Search
  CPC ........... H01L 21/6831; H01L 21/67103; H01L 21/68735; H01L 21/6833; H01J 37/20; H01J 37/3171; H01J 2237/2007
  (Continued)

(56) References Cited

U.S. PATENT DOCUMENTS

| | | | |
|---|---|---|---|
| 10,582,570 B2 | 3/2020 | Parkhe | |
| 2008/0149598 A1* | 6/2008 | Hayashi | H01J 37/32642 156/345.52 |

(Continued)

OTHER PUBLICATIONS

International Search Report dated Feb. 9, 2022 for International Application No. PCT/US2021/058869.

*Primary Examiner* — Kevin J Comber
(74) *Attorney, Agent, or Firm* — Eschweiler & Potashnik, LLC (57) ABSTRACT

A thermal electrostatic clamp has a central electrostatic portion associated with a central region of a workpiece. A central body has a clamping surface and one or more electrodes are associated with the central body. One or more electrodes selectively electrostatically clamp at least the central region of the workpiece to the clamping surface based on an electrical current passed therethrough. One or more first heaters of the central body selectively heat the central electrostatic portion to a first temperature. A non-electrostatic peripheral portion associated with a peripheral region of the workpiece has a peripheral body encircling the central body, separated by a gap. The peripheral body is positioned beneath the peripheral region of the workpiece. The peripheral portion does not electrostatically clamp the peripheral region of the workpiece. One or more second heaters of the peripheral body selectively heat the non-electrostatic peripheral portion to a second temperature.

29 Claims, 6 Drawing Sheets

(58) Field of Classification Search
USPC .......................................................... 361/234
See application file for complete search history.

(56) References Cited

U.S. PATENT DOCUMENTS

| | | | | |
|---|---|---|---|---|
| 2012/0281334 A1* | 11/2012 | Sasaki | ............... | H01J 37/32642 |
| | | | | 361/234 |
| 2016/0307786 A1* | 10/2016 | Evans | ............... | H01L 21/68735 |
| 2018/0190501 A1* | 7/2018 | Ueda | ................. | H01L 21/67069 |
| 2019/0304820 A1* | 10/2019 | Baggett | ................... | H01J 37/20 |

* cited by examiner

(Prior Art)

HYBRID HIGH-TEMPERATURE ELECTROSTATIC CLAMP FOR IMPROVED WORKPIECE TEMPERATURE UNIFORMITY

REFERENCE TO RELATED APPLICATIONS

This application claims the benefit of U.S. Provisional Application Ser. No. 63/112,538 filed Nov. 11, 2020, entitled, "HYBRID HIGH-TEMPERATURE ELECTROSTATIC CLAMP FOR IMPROVED WORKPIECE TEMPERATURE UNIFORMITY", the contents of all of which are herein incorporated by reference in their entirety.

FIELD

The present disclosure relates generally to workpiece processing systems and methods for processing workpieces, and more specifically to a system and method for uniform control of a temperature of a workpiece on a high temperature thermal electrostatic clamp in an ion implantation system.

BACKGROUND

In semiconductor processing, many operations, such as ion implantation, may be performed on a workpiece or semiconductor wafer. As ion implantation processing technology has advanced, a variety of ion implantation temperatures at the workpiece have been implemented to achieve various implantation characteristics in the workpiece. For example, in conventional ion implantation processing, three temperature regimes are typically considered: cold implants, where process temperatures at the workpiece are maintained at temperatures below room temperature; hot implants, where process temperatures at the workpiece are maintained at high temperatures typically ranging from 100-600° C.; and so-called quasi-room temperature implants, where process temperatures at the workpiece are maintained at temperatures slightly elevated above room temperature, but lower than those used in high temperature implants, with quasi-room temperature implant temperatures typically ranging from 50-100° C.

Hot implants, for example, are becoming more common, whereby the process temperature is typically achieved via a dedicated high temperature electrostatic chuck (ESC), also called a heated chuck. The heated chuck holds or clamps the workpiece to a surface thereof during implantation. A conventional high temperature ESC, for example, comprises a set of heaters embedded under the clamping surface for heating the ESC and workpiece to the process temperature (e.g., 100° C.-600° C.), whereby a gas interface conventionally provides a thermal interface from the clamping surface to the backside of the workpiece. Typically, a high temperature ESC is cooled through radiation of energy to the chamber surfaces in the background.

SUMMARY

The present disclosure thus provides a system, apparatus, and method for clamping and controlling a temperature of a workpiece on an electrostatic clamp. Accordingly, the following presents a simplified summary of the disclosure in order to provide a basic understanding of some aspects of the invention. This summary is not an extensive overview of the invention. It is intended to neither identify key or critical elements of the invention nor delineate the scope of the invention. Its purpose is to present some concepts of the invention in a simplified form as a prelude to the more detailed description that is presented later.

In accordance with one aspect of the disclosure, a thermal electrostatic clamp apparatus is provided, wherein an electrostatic clamping member is configured to electrostatically clamp a workpiece thereto. The electrostatic clamping member, for example, is further configured to selectively heat a central region of the workpiece. A non-electrostatic member, for example, generally surrounds a periphery of the electrostatic clamping member, wherein the non-electrostatic member is configured to selectively heat a peripheral region of the workpiece. Further, the non-electrostatic member is not configured to electrostatically clamp the workpiece thereto.

In one example, the electrostatic clamping member defines a central clamping surface and comprises a central body having one or more electrodes embedded therein. The central body, for example, is comprised of a ceramic material, wherein the one or more electrodes are configured to selectively electrostatically clamp at least the central region of the workpiece to the central clamping surface based on an electrical current selectively passed through.

The electrostatic clamping member, for example, further comprises one or more first heaters configured to selectively heat the central region of the workpiece to a first temperature. The one or more first heaters, for example, comprise at least one resistive heater.

In one example, the non-electrostatic member comprises a peripheral body generally encircling the electrostatic clamping member. For example, the peripheral body is separated from the electrostatic clamping member by a gap, whereby thermal stresses associated with thermal expansion and/or contraction of one or more of the central body and peripheral body are minimized.

The peripheral body, in one example, is positioned beneath the peripheral region of the workpiece when the central region of the workpiece is electrostatically clamped to the central clamping surface of the electrostatic clamping member. A top surface of the non-electrostatic member, for example, can be generally co-planar with the central clamping surface of the electrostatic clamping member, wherein the non-electrostatic member is configured to contact the peripheral region of the workpiece. In another example, the top surface of the non-electrostatic member is recessed below the central clamping surface of the electrostatic clamping member, wherein the top surface of the non-electrostatic member is configured to not contact the peripheral region of the workpiece.

In yet another example, the non-electrostatic member further comprises one or more second heaters associated with the peripheral body, whereby the one or more second heaters are configured to selectively heat the peripheral region of the workpiece to a second temperature. A controller, for example, is further provided and configured to selectively energize the one or more first heaters and the one or more second heaters. One or more thermal monitoring devices, for example, are further configured to determine one or more temperatures of one or more of the central region and peripheral region of the workpiece when the workpiece resides on the central clamping surface. The one or more thermal monitoring devices, for example, can comprise one or more direct contact thermal devices configured to directly contact a surface of the workpiece.

The controller, for example, is further configured to selectively energize the one or more first heaters and the one or more second heaters based, at least in part, on the one or more determined temperatures. Further, the one or more first heaters and the one or more second heaters are configured to selectively heat the workpiece to approximately 400 C or greater, thus defining a high temperature electrostatic clamp.

The electrostatic clamping member and the non-electrostatic member, for example, comprise one or more ceramics. In another example, the electrostatic clamping member and the non-electrostatic member are comprised of different materials with respect to one another. For example, the electrostatic clamping member comprises a ceramic material, while the non-electrostatic member comprises one of graphite, silicon, and silicon carbide. In yet another example, one or more mechanical clamps are provided and configured to selectively engage the periphery of the workpiece.

In accordance with another aspect, a thermal electrostatic clamp apparatus is provided, wherein a central electrostatic portion of the thermal electrostatic clamp defines a central clamping surface, wherein the central electrostatic portion is associated with a central region of a workpiece. The central electrostatic portion, for example, comprises a central body having a clamping surface defined thereon, and one or more electrodes associated with the central body. One or more electrodes are configured to selectively electrostatically clamp at least the central region of the workpiece to the clamping surface based, at least in part, on an electrical current selectively passed through the one or more electrodes. The central electrostatic portion, for example, further comprises one or more first heaters associated with the central body, wherein the one or more first heaters are configured to selectively heat the central electrostatic portion to a first temperature.

A non-electrostatic peripheral portion of the thermal electrostatic clamp, for example, is associated with a peripheral region of the workpiece. The non-electrostatic peripheral portion comprises a peripheral body generally encircling the central body and separated from the central body by a gap. The peripheral body, for example, is positioned beneath the peripheral region of the workpiece when the central region of the workpiece is electrostatically clamped to the clamping surface. The peripheral body, for example, is not configured to electrostatically clamp the peripheral region of the workpiece thereto. One or more second heaters associated with the peripheral body, for example, are further configured to selectively heat the non-electrostatic peripheral portion to a second temperature. The first temperature and the second temperature, for example, can differ by greater than 10° C. In another example, the first temperature and the second temperature, for example, can differ by greater than 100° C.

In one example, one or more thermal monitoring devices are configured to determine one or more temperatures associated with one or more of the central body and the peripheral body. The one or more temperatures, for example, associated with a surface of the workpiece. In one example, the one or more thermal monitoring devices comprise one or more direct contact thermal devices configured to directly contact the surface of the workpiece, thereby measuring the one or more temperatures at the surface of the workpiece. The one or more thermal monitoring devices, for example, can comprise one or more of a thermocouple (TC) and a resistance temperature detector (RTD).

In another example, the one or more thermal monitoring devices comprise one or more non-contact thermal devices configured to measure the one or more temperatures of the workpiece without directly contacting the workpiece. The one or more non-contact thermal devices, for example, can comprise one or more of an IR sensor and a pyrometer. In yet another example, the one or more thermal monitoring devices are associated with, or positioned within, the central body and/or peripheral body, whereby the one or more non-contact thermal devices are configured to monitor or infer the one or more temperatures of the workpiece. In another example, a controller is provided and configured to selectively energize the one or more first heaters and the one or more second heaters based on the one or more temperatures determined by the one or more thermal monitoring devices.

In some examples, the central body and the peripheral body comprise, or are comprised of, one or more ceramics. In other examples, the central body and the peripheral body are comprised of different materials with respect to one another. For example, the central body can comprise, or be comprised of, a ceramic material, such as one or more of alumina, aluminum nitride, boron nitride, and quartz, and the peripheral body can comprise or be comprised of, one of graphite, silicon, and silicon carbide.

The peripheral body, for example, has a top surface that is recessed below the clamping surface, wherein the top surface of the peripheral body is configured to not contact the workpiece. In another example, an outer diameter of the peripheral body is greater than or equal to a diameter of the workpiece. in yet another example, the outer diameter of the peripheral body is less than a diameter of the workpiece, such as being approximately 1-3 mm less than the diameter of the workpiece. In yet another example, a shape of the peripheral body generally conforms to a shape of workpiece.

In accordance with another example, the one or more first heaters and the one or more second heaters are configured to selectively heat the workpiece to approximately 150 C or greater. In yet another example, the one or more first heaters and the one or more second heaters are configured to selectively heat the workpiece to approximately 400 C or greater. One or more mechanical clamps can be further provided and configured to selectively engage the peripheral region of the workpiece for supplemental clamping of the periphery of the workpiece.

To the accomplishment of the foregoing and related ends, the disclosure comprises the features hereinafter fully described and particularly pointed out in the claims. The following description and the annexed drawings set forth in detail certain illustrative embodiments of the invention. These embodiments are indicative, however, of a few of the various ways in which the principles of the invention may be employed. Other objects, advantages and novel features of the invention will become apparent from the following detailed description of the invention when considered in conjunction with the drawings.

DETAILED DESCRIPTION

The present invention is directed generally toward workpiece processing systems and apparatuses, and more particularly, to a thermal electrostatic clamp (ESC) and electrostatic clamping system and method for use in an ion implantation system, wherein the ESC is configured to heat a workpiece that is clamped thereto for ion implantation processing. Accordingly, the present invention will now be described with reference to the drawings, wherein like reference numerals may be used to refer to like elements throughout. It should be understood that the description of these aspects are merely illustrative and that they should not be interpreted in a limiting sense. In the following description, for purposes of explanation, numerous specific details are set forth in order to provide a thorough understanding of the present invention. It will be evident to one skilled in the art, however, that the present invention may be practiced without these specific details.

Conventional electrostatic clamp designs for high temperature ion implantations suffer from large temperature drop-offs near the edge of the workpiece, due to the large heat losses (e.g., radiative heat loss) from the near-edge regions of the workpiece that extend beyond the surface of the heated ESC during high temperature operation. Such radiative heat losses can be significant as the target implant temperature of the workpiece exceeds 400 C, whereby the temperature increases by $$T_w^4 - T_a^4 \qquad (1),$$

where $T_w$ is the temperature of the workpiece at the near edge region thereof, and $T_a$ is the ambient temperature directly behind the edge of the workpiece.

The configuration of an ESC for exposing a workpiece to an ion beam in an ion implantation typically cannot have an exposed surface that extends beyond the diameter of the workpiece. For example, in an ESC with a ceramic clamping surface, elemental contamination can occur on the workpiece from sputtering of the ceramic surface by the ion beam, thus decreasing production yields. Further, having such an exposed surface of the ESC can lead to potential damage to the ESC from the ion beam, thus leading to costly repairs or replacement, as well as potential issues with workpiece placement accuracy in high-throughput end stations.

Figure 1A:
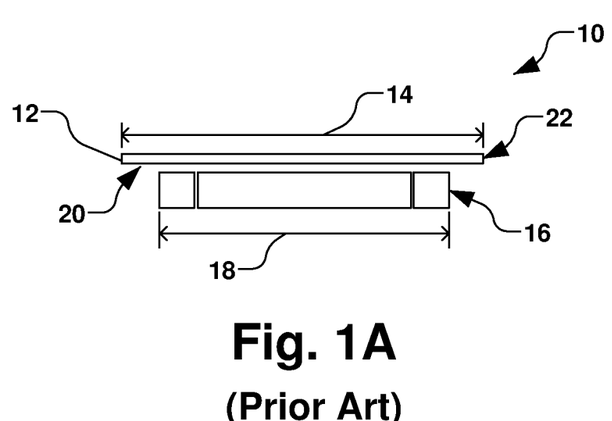
FIG. 1A is a schematic illustration of a conventional ESC having central and peripheral clamping electrodes.
Figure 1B:
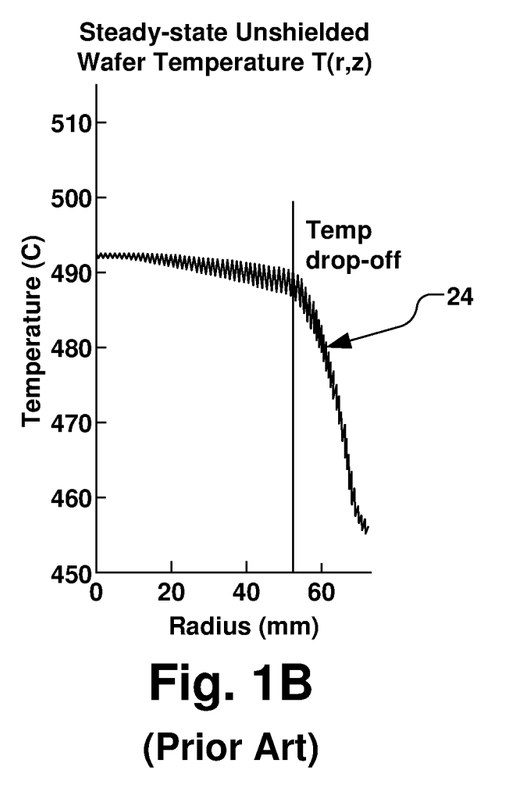
FIG. 1B is a graph of temperature drop-off at an edge of the ESC of FIG. 1A.

Accordingly, an outer diameter of the ESC is configured to be approximately 2-15 mm smaller than the diameter of the workpiece, thus providing an overhang of the workpiece with respect to the ESC. For example, in one conventional clamping system 10 shown in FIG. 1A, a workpiece 12 having a workpiece diameter 14 (e.g., 150 mm) is conventionally supported on a clamping plate 16 having a clamp diameter 18 (e.g., approximately 140 mm). As such, an overhang 20 of the workpiece 12 shown in FIG. 1A can cause significant heat loss from an edge or periphery 22 of the workpiece or clamping plate 16 at high temperatures, thus leading to a sharp temperature drop-off 24 associated with the periphery of the workpiece, as shown in FIG. 1B.

Figure 2A:
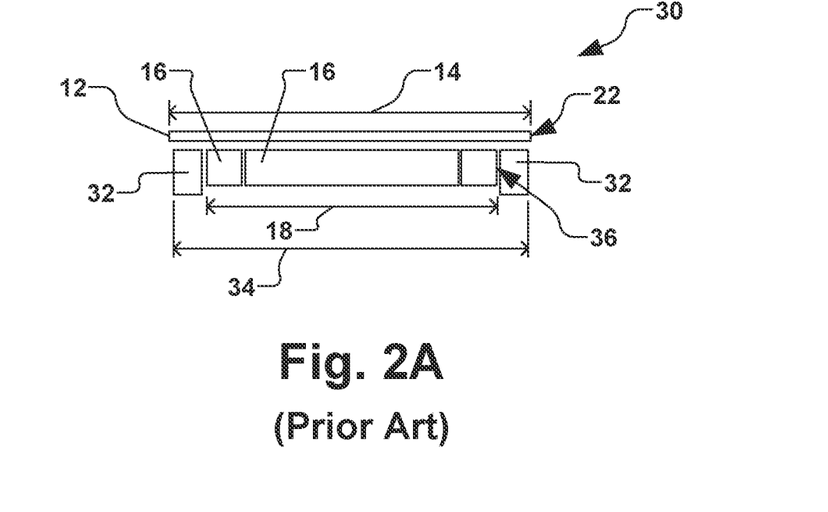
FIG. 2A is a schematic illustration of another conventional ESC having central and peripheral clamping electrodes and a peripheral shield.
Figure 2B:
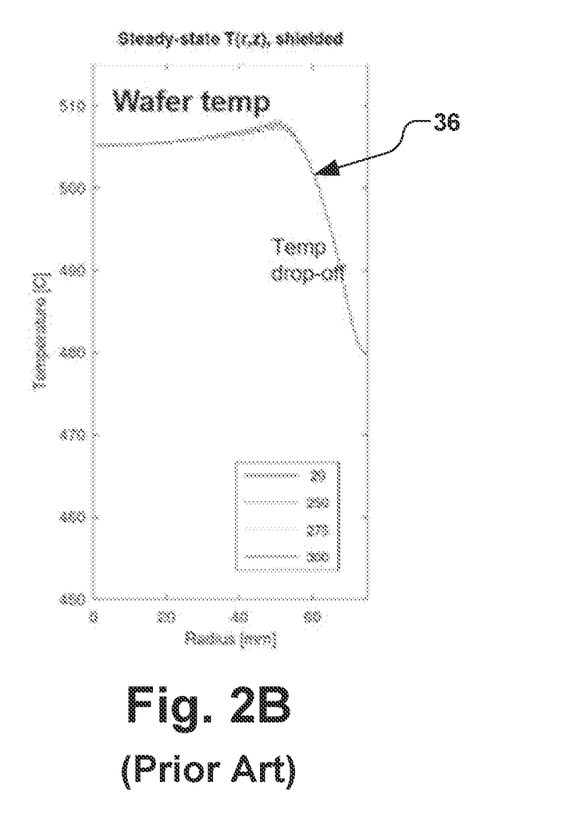
FIG. 2B is a graph of temperature drop-off at an edge of the ESC of FIG. 2A.

In another example conventional clamping system 30 shown in FIG. 2A, one or more thermal shields 32 define a shield diameter 34 (e.g., approximately 148 mm) have been provided in an attempt to minimize the loss of heat from the periphery 22 of the workpiece 12 or clamping plate 16. The conventional shield diameter 34 is typically less than the clamp workpiece diameter 14 to avoid beam strike to the one or more thermal shields 32, but larger than the clamp diameter 18. However, such measures still yield a significant temperature drop-off 36 associated with the edge or periphery of the workpiece 12, as shown in FIG. 2B.

Figure 3:
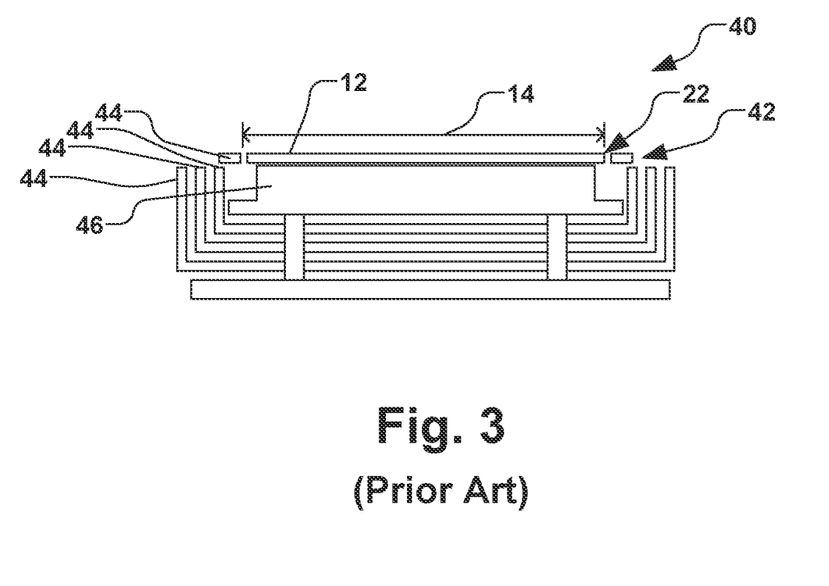
FIG. 3 is a schematic view of still another conventional ESC with a plurality of thermal shields.

Another conventional clamping system 40 is shown in FIG. 3, whereby a multi-level thermal shield assembly 42 comprising a plurality of thermal shields 44 is provided to further increase the radiation shield temperatures in proximity with a clamping plate 46 and periphery 22 of the workpiece. Such a design, however, provides the thermal shields 44 as being extended beyond the workpiece diameter 14 of the workpiece 12, thus increasing the possibility of contamination of the ion implantation system due to direct implantation of the shield materials from ion beam strikes, as well as back-sputtered atomic depositions on the workpiece during the implant. The plurality of thermal shields 44, for example, will generally have a temperature that is greater than a temperature of clamping plate 46 (e.g., greater than ambient temperature). As such, the thermal shields 44 have a limited capability to reduce the temperature drop-off near the edge 22 of the workpiece 12, but cannot sufficiently eliminate the temperature drop-off in some circumstances.

The use of a multi-zone heater (e.g., a heater with 2 zones) can enable a higher temperature in the outer zone of ESC (e.g., proximate to the outer edge of the workpiece) to compensate for the heat loss in this region. It is seen that the outer zone temperature should be at least 100 C above the inner zone temperature to minimize the temperature roll-off near the wafer edge. However, there are limitations on the actual temperature difference that can be maintained on an ESC surface (comprised of ceramic or insulating materials) that heats the workpiece due to the thermal stresses introduced in the surface of the ESC. For example, Von Mises stresses can result from the temperature profiles/differences within the ceramic of an ESC, where in one experiment, the maximum stress increases from 114 MPa to 267 MPa. Such high stresses (e.g., >100 MPa) present a significant risk of mechanical failure of the insulating ceramic used in the ESC.

Figure 4:
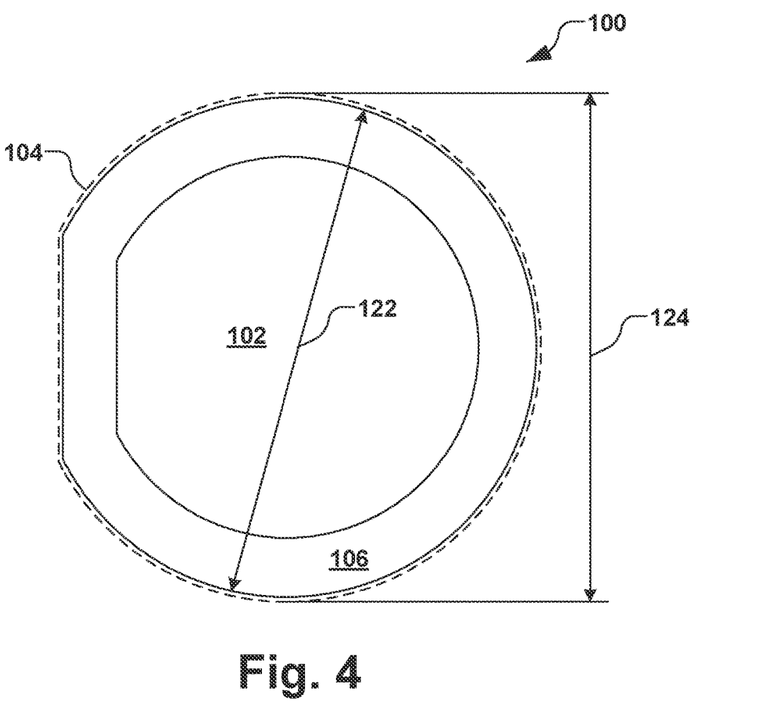
FIG. 4 is a plan view of an example thermal chuck in accordance with an aspect of the present disclosure.
Figure 5:
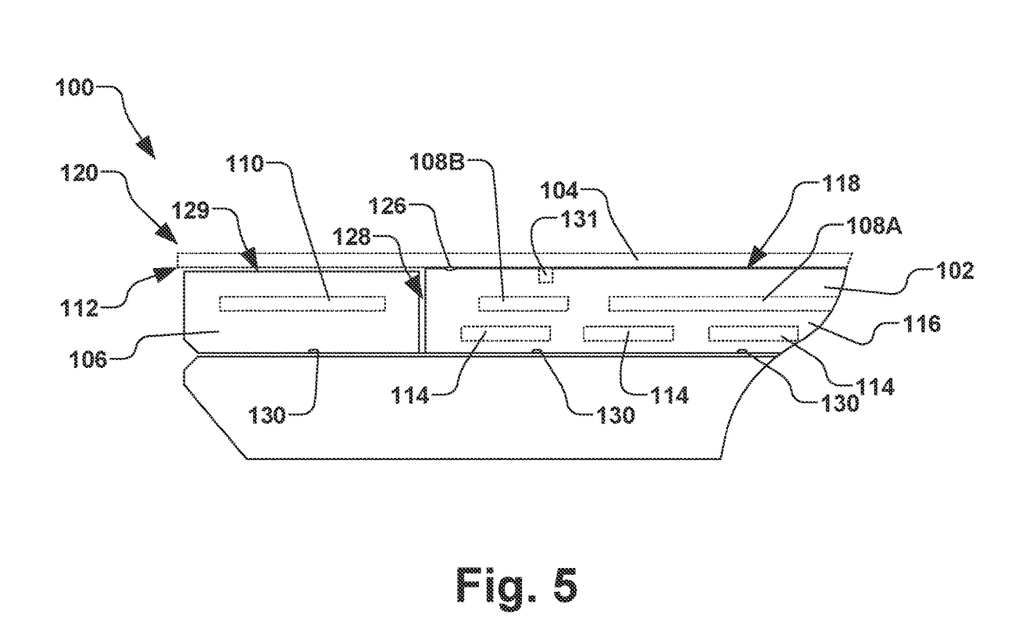
FIG. 5 is a partial cross-sectional view of a peripheral portion and central portion of a thermal chuck in accordance with an aspect of the present disclosure.

The present disclosure thus provides an electrostatic clamping apparatus, system, and method for increasing thermal uniformity in a heated ESC across the workpiece without deleteriously extending a heated portion of the ESC apparatus beyond the diameter of the workpiece. For example, FIGS. 4-5 illustrate an example heated ESC 100 of the present disclosure, whereby the heated ESC overcomes the limitations of the conventional ESCs by providing a multi-component construction (e.g., at least 2 components or parts). For example, an inner or central portion 102 (e.g., an inner zone) of the heated ESC 100 is configured to electrostatically clamp a workpiece 104 thereto, while a peripheral portion 106 (e.g., an outer zone) has no electrostatic clamping capability to electrostatically clamp the workpiece, but rather, is comprised of materials that are substantially compatible with high temperature operation (e.g., ranging from approximately 100 C to 500 C or higher).

The central portion 102, for example, comprises one or more first heaters 108A, 108B, while the peripheral portion 106 comprises one or more second heaters 110. The one or more first heaters 108 and one or more second heaters 110, for example, can be individually controlled to various temperatures, and may provide various sub-zones within the respective central portion 102 and peripheral portion 106 of the ESC 100.

The one or more second heaters 110 associated with the peripheral portion 106, for example, may be heated to a higher temperature than the one or more first heaters 108 associated with the central portion 102 of the ESC 100, such as to account for heat losses associated with a periphery 112 of the workpiece 104 discussed above.

The central portion 102, for example, further has one or more clamping electrodes 114 associated therewith, whereby the one or more clamping electrodes, in conjunction with a material composition 116 of the central portion of the ESC 100, are configured to electrostatically clamp the workpiece 104 to a clamping surface 118, thereof.

One or more of the central portion 102 and peripheral portion 106 of the ESC 100, for example, can comprise, or be comprised of one or more ceramics. In a non-limiting example, the one or more ceramics can comprise one or more of alumina, aluminum nitride, boron nitride, and quartz. Further, it is to understood that the central portion 102 may comprise one or more central portion members that define the central portion. Likewise, the peripheral portion 106 may comprised one or more peripheral portion members that define the peripheral portion.

In one example, the peripheral portion 106 of the ESC 100 can comprise, or be comprised of a material such as, but not limited, to silicon (Si), silicon carbide (SiC), graphite, or other ceramics such as alumina, aluminum Nitride, boron nitride, quartz, etc. The peripheral portion 106 or outer zone heated materials, for example, do not have electrostatic clamping electrodes, but can control and set the temperature of the peripheral portion of the ESC 100 to a significantly higher temperature than the temperature of the central portion 102 of the ESC. As such, a relaxation of requirements (e.g., having no electrostatic clamping function) on the peripheral zone 106 of the ESC provides for a vast choice of materials for higher temperature operation in a peripheral region 120 of the ESC 100 to achieve the desired temperature uniformity on the workpiece 104, while maintaining an ESC diameter 122 of the ESC 100 as being less than a workpiece diameter 124 associated with the workpiece 104. The temperature of the outer zone can be held at the same temp as the ESC or at least 25 C to >200 C higher than the ESC temperature.

Modeled temperature profiles on the workpiece 104 and thermal stresses in the ceramic of the ESC 100 have shown that the stresses within the central portion of the ESC 100 can be minimized by separating the peripheral portion 106 from the central portion 102. Conditions in the model were chosen to target a workpiece temperature of greater than 600 C, with the central portion 102 (e.g., inner zone having electrostatic clamping functionality) set to 700 C and the peripheral portion 106 (e.g., outer zone having no electrostatic clamping functionality) being maintained at 840 C, which provides a significant temperature difference between the two zones. The resulting temperature distribution in the two portions of the clamp assembly resulted in lower von Mises stresses than conventional ESCs. The above configuration resulted in maintaining the stresses below 50 Mpa on all the central portion 102 (e.g., the ceramic portion), thus reducing a risk of failure due to thermal stresses. The resulting temperature profile on the workpiece further provided significantly better thermal uniformity at a base workpiece temperature above 600 C, as opposed to conventional ESCs. The present disclosure contemplates further improvements in the temperature roll-off near the edge or periphery 120 of the workpiece 104 being achieved by pushing or otherwise optimizing the peripheral or outer zone temperature slightly higher.

The hybrid design of the ESC 100 of the present disclosure (e.g., an electrostatic central portion and non-electrostatic peripheral portion) thus enables the ESC 100 to be simplified with a symmetrical ceramic central portion 102 with minimal sharp features (e.g., stress points), such as cutouts for lift pins, workpiece pick points, etc., while maintaining the electrostatic clamping functionality in the central portion or inner zone, while enabling a choice of higher-temperature materials for the peripheral portion 106 or outer zone that do not have to simultaneously have the material and electrical (e.g., insulating) properties for the ESC 100 to function properly. Further improvements to this design are also contemplated, such as by integrating multiple heating zones (e.g., greater than one zone) and associated second heaters 110 in the peripheral portion 106 or annular ring. Additionally, the present disclosure contemplates integrating backside gas cooling between the workpiece 104 and clamping surface 118 via seal rings 126 associated with the peripheral portion 106 of the ESC 100. The peripheral portion 106 and central portion 102, for example, may be further separated by a gap 128, such that stresses therebetween may be further minimized.

Further, in another example, the present disclosure contemplates a top surface 129 of the peripheral portion 106 being positioned slightly lower than the clamping surface 118 associated with the central portion 102 and seal rings 126 of the inner zone of the ESC. The lower peripheral portion 106, for example, can enable the ESC 100 to more efficiently handle and clamp workpieces that may be bowed. For example, if the workpiece is presented to the ESC 100 with a convex upwards (e.g., upside down bowl shape), the peripheral edge 120 of the workpiece 104 resting on the peripheral portion 106 or the ESC, being lower, will still enable a closer proximity of the workpiece to the clamping surface 118 in the central portion 102, as opposed to a traditional ESC, where such a bowed workpiece edge may rest on an edge sealing ring, but the center of the workpiece is further removed from the clamping surface.

Further, the present disclosure provides beneficial handling and electrostatic clamping a workpiece having an inverse bow (e.g., convex downwards or upright bowl), whereby the near-center surface of the workpiece remains in close proximity to the electrostatic clamping surface 118.

In accordance with one example, one or more thermal monitoring devices 130 may be provided to determine a temperature of the workpiece or ESC 100. The one or more thermal monitoring devices 130, for example, may be configured to directly contact a backside surface of the workpiece 104. For example, the one or more thermal monitoring devices 130 may comprise one or more direct contact thermal devices 131 such as one or more of a thermocouple (TC) and a resistance temperature detector (RTD).

Figure 6:
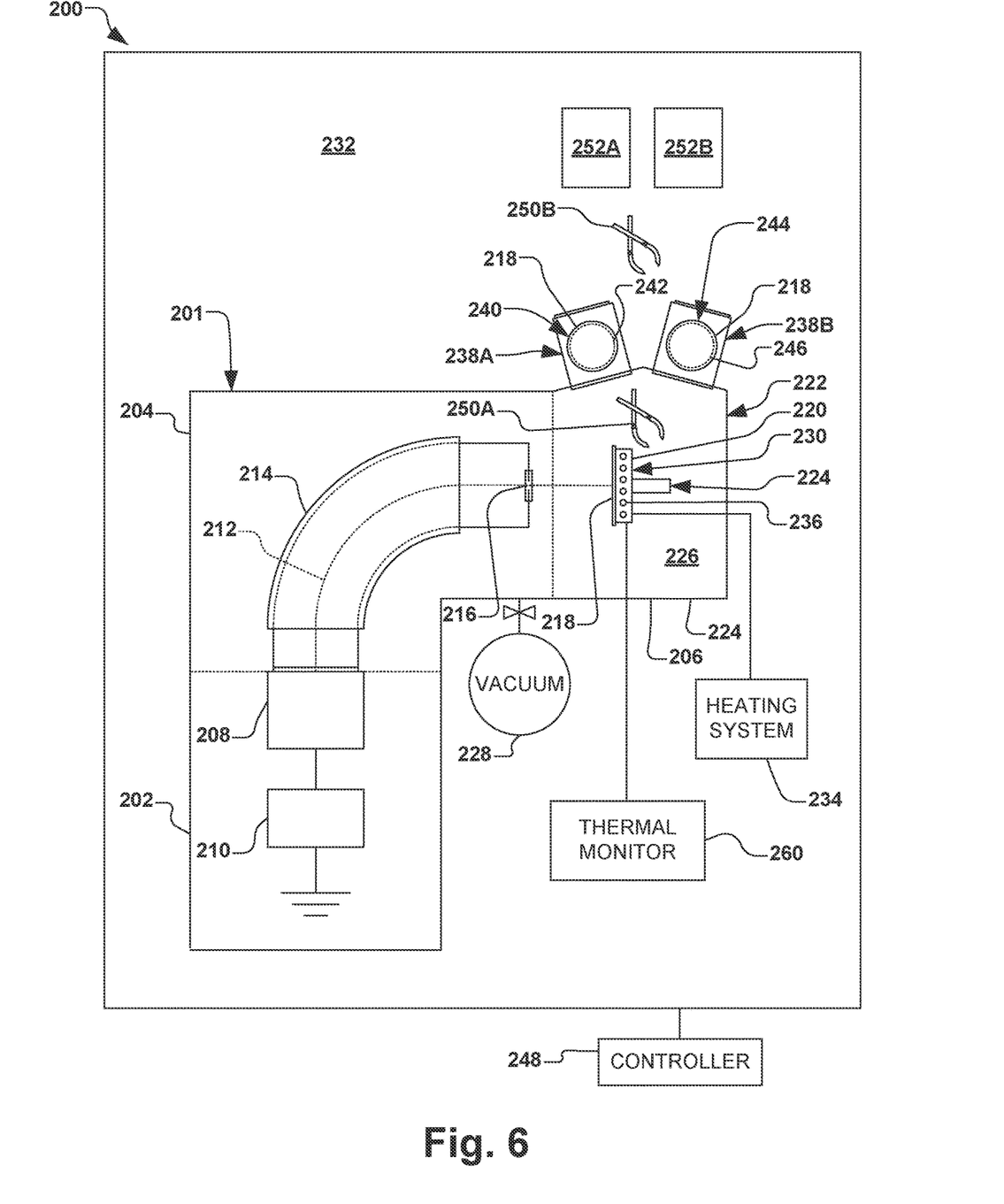
FIG. 6 illustrates a block diagram of an exemplified heated ion implantation system in accordance with an aspect of the present disclosure.

In accordance with yet another example of the disclosure, FIG. 6 illustrates an example heated ion implantation system 200 configured to heat a workpiece to process temperatures in the range of 100 C-600 C or greater. The process temperature, for example, is, in part, achieved and maintained at the electrostatic clamp 100 that supports the workpiece 104 during ion implantation.

In accordance with various aspects of the present disclosure, FIG. 6 illustrates an exemplified ion implantation system 200. The ion implantation system 200 in the present example comprises an exemplified ion implantation apparatus 201, however various other types of vacuum-based semiconductor processing systems are also contemplated, such as plasma processing systems, or other semiconductor processing systems. The ion implantation apparatus 201, for example, comprises a terminal 202, a beamline assembly 204, and an end station 206.

Generally speaking, an ion source 208 in the terminal 202 is coupled to a power supply 210 to ionize a dopant gas into a plurality of ions and to form an ion beam 212. The ion beam 212 in the present example is directed through a mass analysis apparatus 214, and out an aperture 216 towards the end station 206. In the end station 206, the ion beam 212 bombards a workpiece 218 (e.g., a substrate such as a silicon wafer, a display panel, etc.), such as the workpiece 104 of FIGS. 4-5 which is selectively clamped or mounted to a chuck 220. The chuck 220 of FIG. 6, for example, may comprise the electrostatic clamp (ESC) 100 of FIGS. 4-5 described above, wherein the chuck is configured to selectively control a temperature of the workpiece 218. Once embedded into the lattice of the workpiece 218 of FIG. 6, for example, the implanted ions change the physical and/or chemical properties of the workpiece. Because of this, ion implantation is used in semiconductor device fabrication and in metal finishing, as well as various applications in materials science research.

The ion beam 212 of the present disclosure can take any form, such as a pencil or spot beam, a ribbon beam, a scanned beam, or any other form in which ions are directed toward end station 206, and all such forms are contemplated as falling within the scope of the disclosure.

According to one exemplified aspect, the end station 206 comprises a process chamber 222, such as a vacuum chamber 224, wherein a process environment 226 is associated with the process chamber. The process environment 226 generally exists within the process chamber 222, and in one example, comprises a vacuum produced by a vacuum source 228 (e.g., a vacuum pump) coupled to the process chamber and configured to substantially evacuate the process chamber.

In one example, the ion implantation apparatus 201 is configured to provide a high temperature ion implantation, wherein the workpiece 218 is heated to a process temperature (e.g., approximately 100-600° C. or greater). Thus, in the present example, the chuck 220 comprises a thermal chuck 230, wherein the thermal chuck is configured to support and retain the workpiece 218 while further heating the workpiece within the process chamber 222 prior to, during, and/or after the exposure of the workpiece to the ion beam 212.

The thermal chuck 230, for example, comprises an electrostatic chuck configured to heat the workpiece 218 to a processing temperature that is considerably greater than an ambient or atmospheric temperature of the surroundings or external environment 232 (e.g., also called an "atmospheric environment"). A heating system 234 may be further provided, wherein the heating system is configured to heat the thermal chuck 230 and, in turn, the workpiece 218 residing thereon to the desired processing temperature. The heating system 234, for example, is configured to selectively heat the workpiece 218 via one or more heaters 236 disposed within the thermal chuck 230. The one or more heaters 236, for example, may comprise one or more resistive heating elements. In one alternative, the heating system 234 comprises a radiant heat source, whereby the one or more heaters 236 comprise one or more a halogen lamp, light emitting diode, and infrared thermal device configured to selectively heat the workpiece 218.

For some high temperature implants, the workpiece 218 may allowed to "soak" on the thermal chuck 230 within the vacuum of the process environment 226 until the desired temperature is reached. Alternatively, in order to increase cycle time through the ion implantation system 200 the workpiece may be preheated in one or more chambers 238A, 238B (e.g., one or more load lock chambers) operatively coupled to the process chamber 222 via a pre-heat apparatus 240. The pre-heat apparatus 240, for example, may comprise a pre-heat support 242 configured similar to the thermal chuck 230.

Depending on the tool architecture, process, and desired throughput, the workpiece 218 may be preheated to the first temperature via the pre-heat apparatus 240, wherein the first temperature is equal to or lower than the process temperature, thus allowing for a final thermal equalization on the thermal chuck 230 inside the vacuum chamber 224. Such a scenario allows the workpiece 218 to lose some heat during transfer to the process chamber 222, wherein final heating to the process temperature is performed on the thermal chuck 230. Alternatively, the workpiece 218 may be preheated via the pre-heat apparatus 240 to a first temperature that is higher than the process temperature. Accordingly, the first temperature would be optimized so that cooling of the workpiece 218 during transfer to the process chamber 222 is just enough for the workpiece to be at the desired process temperature as it is clamped onto the thermal chuck 230.

In order to accurately control and/or accelerate the thermal response and enable an additional mechanism for heat transfer, the back side of the workpiece 218 is brought into conductive communication with the thermal chuck 230. This conductive communication is achieved, for example, through a pressure-controlled gas interface (also called "back side gas") between the thermal chuck 230 and the workpiece 218. Pressure of the back side gas, for example, is generally limited by the electrostatic force of the thermal chuck 230, and can be generally kept in the range of 5-20 Torr. In one example, the back side gas interface thickness (e.g., the distance between the workpiece 218 and the thermal chuck 230) is controlled on the order of microns (typically 5-20 µm), and as such, the molecular mean free path in this pressure regime becomes large enough for the interface thickness to push the system into the transitional and molecular gas regime.

In accordance with another aspect of the disclosure, chamber 238B comprises a cooling apparatus 244 configured to cool the workpiece when the workpiece 218 is disposed within the chamber 238B subsequent to being implanted with ions during ion implantation. The cooling apparatus 244, for example, may comprise a chilled workpiece support 246, wherein the chilled workpiece support is configured to actively cool the workpiece 218 residing thereon via thermal conduction. The chilled workpiece support 246, for example, comprises a cold plate having a one or more cooling channels passing therethrough, wherein a cooling fluid passing through the cooling channel substantially cools the workpiece 218 residing on a surface of the cold plate. The chilled workpiece support 246 may comprise other cooling mechanisms, such as Peltier coolers or other cooling mechanisms known to one of ordinary skill.

In accordance with another exemplified aspect, a controller 248 is further provided and configured to selectively activate one or more of the heating system 234, the pre-heat apparatus 240, and the cooling apparatus to selectively heat or cool the workpiece 218 respectively residing thereon. The controller 248, for example, may be configured to heat the workpiece 218 in chamber 238A via the pre-heat apparatus 240, to heat the workpiece to a predetermined temperature in the processing chamber 222 via the thermal chuck 230 and heating system 234, to implant ions into the workpiece via the ion implantation apparatus 201, to cool the workpiece in chamber 238B via the cooling apparatus 244, and to selectively transfer the workpiece between the external environment 232 and the process environment 226 via one or more workpiece transfer apparatuses 250A, 250B.

In one example, the workpiece 218 may be further delivered to and from the process chamber 222 such that the workpiece is transferred between a selected front opening unified pod (FOUP) 252A, 252B and chambers 238A, 238B via workpiece transfer apparatus 250B, and further transferred between the chambers 238A, 238B and the thermal chuck 230 via workpiece transfer apparatus 250A. The controller 248, for example, is further configured to selectively transfer the workpiece between the FOUPs 252A, 252B, chambers 238A, 238B, and thermal chuck 230 via a control of the workpiece transfer apparatus 250A, 250B.

A thermal monitoring device 260 is provided and may comprise the one or more direct contact thermal devices 131 of FIG. 5. The one or more direct contact thermal devices 131, for example, may comprise one or more spring-loaded devices (not shown), such as a spring-loaded TC, whereby the one or more spring-loaded devices are compliant such that the workpiece 218 of FIG. 6 puts pressure on the one or more spring-loaded devices when placed on the thermal chuck 230, but with a minimal amount of contact pressure.

Figure 7:
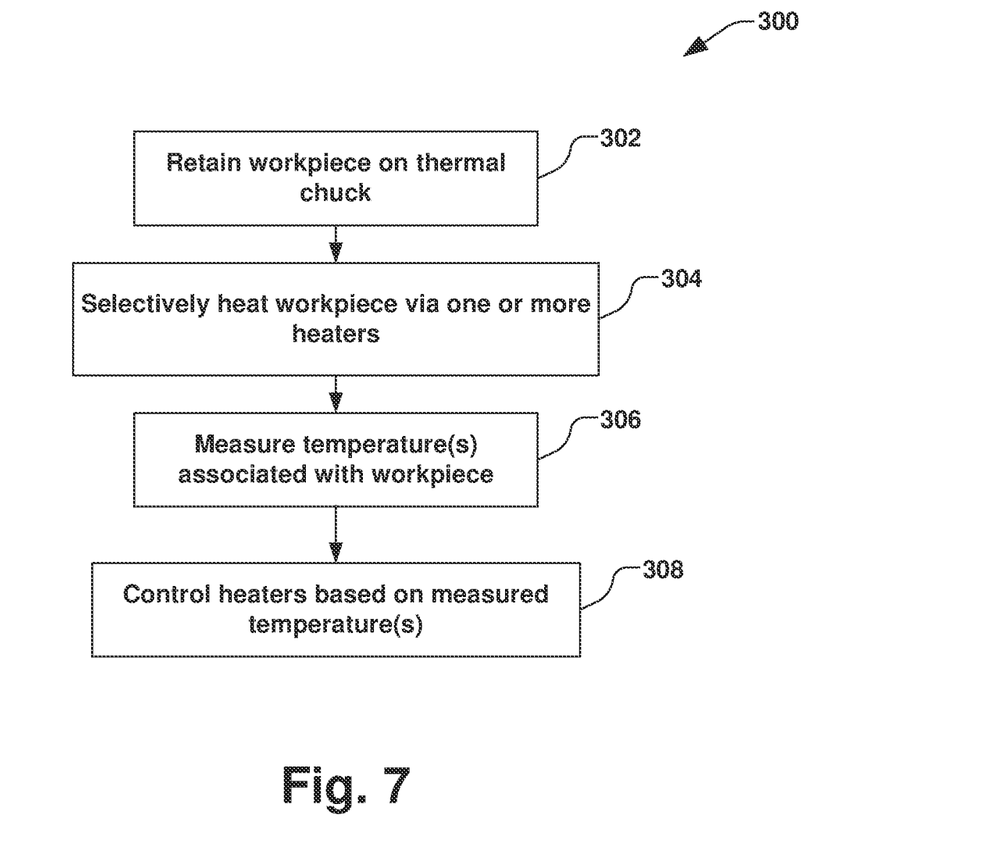
FIG. 7 is a block diagram illustrating an exemplified method for temperature control of a workpiece according to another aspect of the disclosure.

In another aspect of the disclosure, FIG. 7 illustrates a method 300 for controlling a temperature of a workpiece. It should be noted that while exemplified methods are illustrated and described herein as a series of acts or events, it will be appreciated that the present disclosure is not limited by the illustrated ordering of such acts or events, as some steps may occur in different orders and/or concurrently with other steps apart from that shown and described herein, in accordance with the disclosure. In addition, not all illustrated steps may be required to implement a methodology in accordance with the present disclosure. Moreover, it will be appreciated that the methods may be implemented in association with the systems illustrated and described herein as well as in association with other systems not illustrated.

The method 300 shown in FIG. 7, for example, control the temperature of a workpiece positioned on a thermal chuck. In act 302, for example, the workpiece is electrostatically attracted to a central portion of a thermal chuck. In act 304, the clamping surface of the thermal chuck is selectively heated by selectively energizing one or more heaters associated with the thermal chuck, thereby selectively heating one or more locations on the workpiece. In act 306, a temperature of the workpiece or ESC is determined when the workpiece resides on the clamping surface of the thermal chuck via a thermal monitoring device, therein defining a measured temperature. The temperature of the workpiece may be determined by directly contacting a surface of the workpiece with a temperature measurement device, by measuring the emissivity or temperature of the workpiece by a non-contact thermal device, or a combination of both. In act 308, the one or more heaters are selectively energized based on the measured temperature, wherein precise and accurate temperature control of the workpiece, itself, is advantageously achieved.

Although the disclosure has been shown and described with respect to a certain preferred embodiment or embodiments, it is obvious that equivalent alterations and modifications will occur to others skilled in the art upon the reading and understanding of this specification and the annexed drawings. In particular regard to the various functions performed by the above described components (assemblies, devices, circuits, etc.), the terms (including a reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplified embodiments of the disclosure. In addition, while a particular feature of the disclosure may have been disclosed with respect to only one of several embodiments, such feature may be combined with one or more other features of the other embodiments as may be desired and advantageous for any given or particular application.

What is claimed is:

1. A thermal electrostatic clamp apparatus, comprising:
an electrostatic clamping member configured to electrostatically clamp a workpiece thereto and to selectively heat a central region of the workpiece; and
a non-electrostatic member generally surrounding a periphery of the electrostatic clamping member, wherein the non-electrostatic member is configured to selectively heat a peripheral region of the workpiece, wherein a top-most surface of the non-electrostatic member faces the workpiece and is contiguous and planar about the peripheral region of the workpiece, and wherein the non-electrostatic member is not configured to electrostatically clamp the workpiece thereto.

2. The thermal electrostatic clamp apparatus of claim 1, wherein the electrostatic clamping member defines a central clamping surface and comprises a central body having one or more electrodes embedded therein, wherein the one or more electrodes are configured to selectively electrostatically clamp at least the central region of the workpiece to the central clamping surface based on an electrical current selectively passed through.

3. The thermal electrostatic clamp apparatus of claim 2, wherein the electrostatic clamping member further comprises one or more first heaters configured to selectively heat the central region of the workpiece to a first temperature.

4. The thermal electrostatic clamp apparatus of claim 3, wherein the one or more first heaters comprise at least one resistive heater.

5. The thermal electrostatic clamp apparatus of claim 3, wherein the non-electrostatic member comprises a peripheral body generally encircling the electrostatic clamping member and separated from the electrostatic clamping member by a gap.

6. The thermal electrostatic clamp apparatus of claim 5, wherein the peripheral body is positioned beneath the peripheral region of the workpiece when the central region of the workpiece is electrostatically clamped to the central clamping surface of the electrostatic clamping member.

7. The thermal electrostatic clamp apparatus of claim 5, wherein the non-electrostatic member further comprises one or more second heaters associated with the peripheral body and configured to selectively heat the peripheral region of the workpiece to a second temperature.

8. The thermal electrostatic clamp apparatus of claim 7, further comprising a controller configured to selectively energize the one or more first heaters and the one or more second heaters.

9. The thermal electrostatic clamp apparatus of claim 8, further comprising one or more thermal monitoring devices configured to determine one or more temperatures of one or more of the central region and the peripheral region of the workpiece when the workpiece resides on the central clamping surface, wherein the controller is configured to selectively energize the one or more first heaters and the one or more second heaters based, at least in part, on the one or more determined temperatures.

10. The thermal electrostatic clamp apparatus of claim 9, wherein the one or more thermal monitoring devices comprises one or more direct contact thermal devices configured to directly contact a surface of the workpiece.

11. The thermal electrostatic clamp apparatus of claim 7, wherein the one or more first heaters and the one or more second heaters are configured to selectively heat the workpiece to approximately 400 C or greater.

12. The thermal electrostatic clamp apparatus of claim 2, wherein the top-most surface of the non-electrostatic member is generally co-planar with the central clamping surface of the electrostatic clamping member and wherein the non-electrostatic member is configured to contact the peripheral region of the workpiece.

13. The thermal electrostatic clamp apparatus of claim 2, wherein the top-most surface of the non-electrostatic member is recessed below the central clamping surface of the electrostatic clamping member, wherein the top-most surface of the non-electrostatic member is configured to not contact the peripheral region of the workpiece.

14. The thermal electrostatic clamp apparatus of claim 1, wherein the electrostatic clamping member and the non-electrostatic member comprise one or more ceramics.

15. The thermal electrostatic clamp apparatus of claim 1, wherein the electrostatic clamping member and the non-electrostatic member are comprised of different materials with respect to one another.

16. The thermal electrostatic clamp apparatus of claim 1, wherein the electrostatic clamping member comprises a ceramic material and the non-electrostatic member comprises one of graphite, silicon, and silicon carbide.

17. The thermal electrostatic clamp apparatus of claim 1, further comprising one or more mechanical clamps configured to selectively engage the periphery of the workpiece.

18. A thermal electrostatic clamp apparatus, comprising:
a central electrostatic portion defining a central clamping surface, wherein the central electrostatic portion is associated with a central region of a workpiece and wherein the central electrostatic portion comprises:
a central body having a clamping surface defined thereon;
one or more electrodes associated with the central body, wherein the one or more electrodes are configured to selectively electrostatically clamp at least the central region of the workpiece to the clamping surface based, at least in part, on an electrical current selectively passed through the one or more electrodes; and
one or more first heaters associated with the central body and configured to selectively heat the central electrostatic portion to a first temperature; and
a non-electrostatic peripheral portion, wherein the non-electrostatic peripheral portion is associated with a peripheral region of the workpiece, wherein the non-electrostatic peripheral portion comprises:
a peripheral body generally encircling the central body and separated from the central body by a gap, wherein the peripheral body is positioned beneath the peripheral region of the workpiece when the central region of the workpiece is electrostatically clamped to the clamping surface, wherein a top-most surface of the peripheral body faces the workpiece and is contiguous and planar about the peripheral region of the workpiece, and wherein the peripheral body is not configured to electrostatically clamp the peripheral region of the workpiece thereto; and
one or more second heaters associated with the peripheral body and configured to selectively heat the non-electrostatic peripheral portion to a second temperature.

19. The thermal electrostatic clamp apparatus of claim 18, further comprising one or more thermal monitoring devices configured to determine one or more temperatures associated with one or more of the central body and the peripheral body.

20. The thermal electrostatic clamp apparatus of claim 19, wherein the one or more temperatures are at a surface of the workpiece, and wherein the one or more thermal monitoring devices comprise one or more direct contact thermal devices configured to directly contact the surface of the workpiece.

21. The thermal electrostatic clamp apparatus of claim 19, wherein the one or more thermal monitoring devices comprise one or more non-contact thermal devices configured to measure the one or more temperatures of the workpiece without directly contacting the workpiece.

22. The thermal electrostatic clamp apparatus of claim 19, further comprising a controller configured to selectively energize the one or more first heaters and the one or more second heaters based on the one or more temperatures determined by the one or more thermal monitoring devices.

23. The thermal electrostatic clamp apparatus of claim 18, wherein the central body and the peripheral body comprise one or more ceramics.

24. The thermal electrostatic clamp apparatus of claim 18, wherein the central body and the peripheral body are comprised of different materials with respect to one another.

25. The thermal electrostatic clamp apparatus of claim 18, wherein the central body comprises a ceramic material and the peripheral body comprises one of graphite, silicon, and silicon carbide.

26. The thermal electrostatic clamp apparatus of claim 18, wherein the top-most surface of the peripheral body is recessed below the clamping surface, wherein the top-most surface of the peripheral body is configured to not contact the workpiece.

27. The thermal electrostatic clamp apparatus of claim 18, wherein an outer diameter of the peripheral body is greater than or equal to a diameter of the workpiece.

28. The thermal electrostatic clamp apparatus of claim 18, wherein the one or more first heaters and the one or more second heaters are configured to selectively heat the workpiece to approximately 400 C or greater.

29. The thermal electrostatic clamp apparatus of claim 18, further comprising one or more mechanical clamps configured to selectively engage the peripheral region of the workpiece.

* * * * *